(12) United States Patent
Schmutz et al.

(10) Patent No.: US 7,232,284 B1
(45) Date of Patent: Jun. 19, 2007

(54) DEVICE FOR LOADING SUBSTRATES INTO AND UNLOADING THEM FROM A CLEAN ROOM

(75) Inventors: Wolfgang Schmutz, Zimmern (DE); Josef Gentischer, Remshalden (DE)

(73) Assignee: Brooks Automation, Inc., Chelmsford, MA (US)

( * ) Notice: Subject to any disclaimer, the term of this patent is extended or adjusted under 35 U.S.C. 154(b) by 966 days.

(21) Appl. No.: 09/600,879

(22) PCT Filed: Feb. 11, 1999

(86) PCT No.: PCT/EP99/00883

§ 371 (c)(1),
(2), (4) Date: Aug. 14, 2000

(87) PCT Pub. No.: WO99/41771

PCT Pub. Date: Aug. 19, 1999

(30) Foreign Application Priority Data

Feb. 12, 1998 (DE) ................................ 198 05 624

(51) Int. Cl.
*B65G 49/07* (2006.01)

(52) U.S. Cl. ........................................ 414/217; 414/939

(58) Field of Classification Search ................ 414/217, 414/217.1, 935, 940, 939; 118/719, 500; 49/482.1, 452, 505
See application file for complete search history.

(56) References Cited

U.S. PATENT DOCUMENTS

| | | | |
|---|---|---|---|
| 4,139,972 A * | 2/1979 | Naka | ............................ 52/208 |
| 5,364,219 A | 11/1994 | Takahashi et al. | |
| 5,431,600 A | 7/1995 | Murata et al. | |
| 5,538,385 A * | 7/1996 | Bacchi et al. | ................ 414/403 |
| 5,655,342 A * | 8/1997 | Guillemet et al. | ............. 52/217 |
| 5,772,386 A * | 6/1998 | Mages et al. | ............ 414/940 X |
| 6,013,920 A * | 1/2000 | Gordon et al. | ........... 414/937 X |
| 6,068,668 A * | 5/2000 | Mastroianni | ............ 414/940 X |
| 6,120,371 A * | 9/2000 | Robertson, Jr. et al. | 414/940 X |
| 6,135,702 A * | 10/2000 | Huang et al. | ............ 414/940 X |
| 6,138,721 A * | 10/2000 | Bonora et al. | ........... 414/940 X |
| 6,142,723 A * | 11/2000 | Kang | ..................... 414/940 X |
| 6,220,808 B1 * | 4/2001 | Bonora et al. | ........... 414/840 X |
| 6,261,044 B1 * | 7/2001 | Fosnight et al. | ......... 414/940 X |

FOREIGN PATENT DOCUMENTS

| | | |
|---|---|---|
| DE | 4024973 A1 | 2/1992 |
| DE | 4207341 C1 | 7/1993 |
| DE | 19542646 A1 | 10/1996 |
| EP | 0735573 A1 | 10/1996 |
| JP | 363104347 * 5/1988 | ................ 414/940 |
| WO | WO 97/02199 | 1/1997 |

* cited by examiner

*Primary Examiner*—James Keenan
(74) *Attorney, Agent, or Firm*—Perman & Green, LLP; Richard Pickreign

(57) ABSTRACT

The invention relates to a device for loading substrates into and unloading them from a clean room, comprising a lock device onto which a transport box for receiving the substrates can be placed and which is fitted with a hermetically sealing lock opening, and a process unit adjacent to the lock opening. To allow for a valid adjustment of the lock device in relation to the process unit even when the lock device is exchanged, the invention provides for an adapter device to be positioned between the process unit and the lock device to which the lock device can be removably fixed and which is maintained at the level of the process unit and can be adjustably aligned in relation to same.

20 Claims, 5 Drawing Sheets

DEVICE FOR LOADING SUBSTRATES INTO AND UNLOADING THEM FROM A CLEAN ROOM

FIELD OF THE INVENTION

The present invention relates to a device for loading and unloading substrates into or from a clean room having a lock device, on which a transport box can be brought for receiving the substrates and which is provided with a hermetically sealed opening, and which has a processing installation adjoining the locking opening.

BACKGROUND OF THE INVENTION

With known devices of this type, the processing installation has a manipulating device, by means of which the substrates can be brought from a transport box into the processing installation or vice versa, when the transport box is docked at a lock opening. The exact position of the transport box with respect to the manipulating device, and therefore the processing installation, is important here. This orientation is performed once in a relatively extensive manner during the installation of the device. If now the lock device must be exchanged for whatever reason, another elaborate adjustment of the exchanged lock device with respect to the processing installation is necessary.

SUMMARY OF THE INVENTION

It is therefore the object of the present invention to provide a device for loading and unloading substrates into or from a clean room of the type mentioned at the outset, wherein an adjustment of the lock device with respect to the processing installation, which is still applicable in case of an exchange of the lock device, is possible.

To attain this object in a device for loading and unloading substrates into or from a clean room of the type mentioned at the outset, an adapter device is provided which is arranged between the processing installation and the lock device, on which the lock device can be releasably fastened and which is held on the processing installation and can be adjustably oriented with respect thereto.

It can be achieved by means of the measures in accordance with the present invention that the frame-like adapter device needs to be oriented or adjusted with respect to the position of the processing device or its manipulating device only once, since then this adapter device always remains and is used as a once adjusted receiver for the lock device. This saves considerable outlay in work and time in case the lock device needs to be exchanged for another one, for example following an error indication.

It is achieved in an advantageous manner that the adapter device can be adjusted with respect to the processing device in a desired direction, or in practically all conceivable ones, i.e. placed vertically or horizontally, for example.

For setting the adapter device in the Z-direction, or for tilting it around the X-axis. The underside of the adapter is connected with two spaced apart, height-adjustable forcing screws which are held on a stationary element.

A setting around the Y-axis, in the direction of the X- and Y-axis, or the like, is achieved by the provision of adjustable forcing screws which are supported on a component of the processing installation.

For the appropriate fixation of the setting fastening screws are provided which pass through bores of larger diameter.

The connection of the respective lock device with the adapter device is achieved in a quick and simple manner by means of spaced apart indexing pins, which can be fittingly and essentially free of play plugged into receiving bores of the lock device. A simple exchangeability of the lock device results from the fact that the lock device has a base plate which has a bore pattern corresponding to the arrangement of the indexing pins in the adaptor device.

In a further embodiment which makes possible a quick and simple pre-positioned placement of a transport box on the receiving table, which is displaceable, i.e. it can be docked at the lock opening, a roller track is provided in the area of the receiving table. If in the course of pivoting the roller track, preferably +90° and providing vertically upward extending lateral insertion slopes, the transport box can be brought in a simple manner on the roller track from two or three lateral directions, as well as from above, and therefore on the receiving table. A defined holding position of the transport box on the roller track results from inclining the roller track slightly in the direction toward the processing installation, or toward a loading and unloading level It is structurally useful if the roller track is embodied to have two parallel track elements connected by a loop and extending on both sides of the receiving table. Useful further embodiments of the roller track therefore result from connecting the connecting loop to a lever whose other end is pivotably mounted on a vertical shaft, with the lever pivot shaft being displaceable in height.

In a further embodiment of the present invention, an advantageous construction in accordance with the provision of a lock door which can be connected with a cover is provided for the ability of hermetically sealing the lock opening by means of the lock door. Constructive embodiments ensue by the provision of a clutch disk connected with a parallelogram device, which is moved by a motor-driven worn-gear. The parallelogram drive has a hinged connecting rod from which a manual lever projects, and which is accessible from the outside.

Advantages in regard to constructive and technical labor outlay result from the closing movement of the lock door, the displacement movement of the receiving table and the lowering movement of the receiving table and the lowering movement of the roller track are derived from a similar crank drive, with the drive for these movements arranged inside the lock device.

Further details of the present invention can be taken from the following description, in which the present invention is described in greater detail and explained by means of the exemplary embodiment represented in the drawings.

BRIEF DESCRIPTIONS OF THE DRAWINGS

DESCRIPTION OF THE PREFERRED EMBODIMENTS

Figure 1:
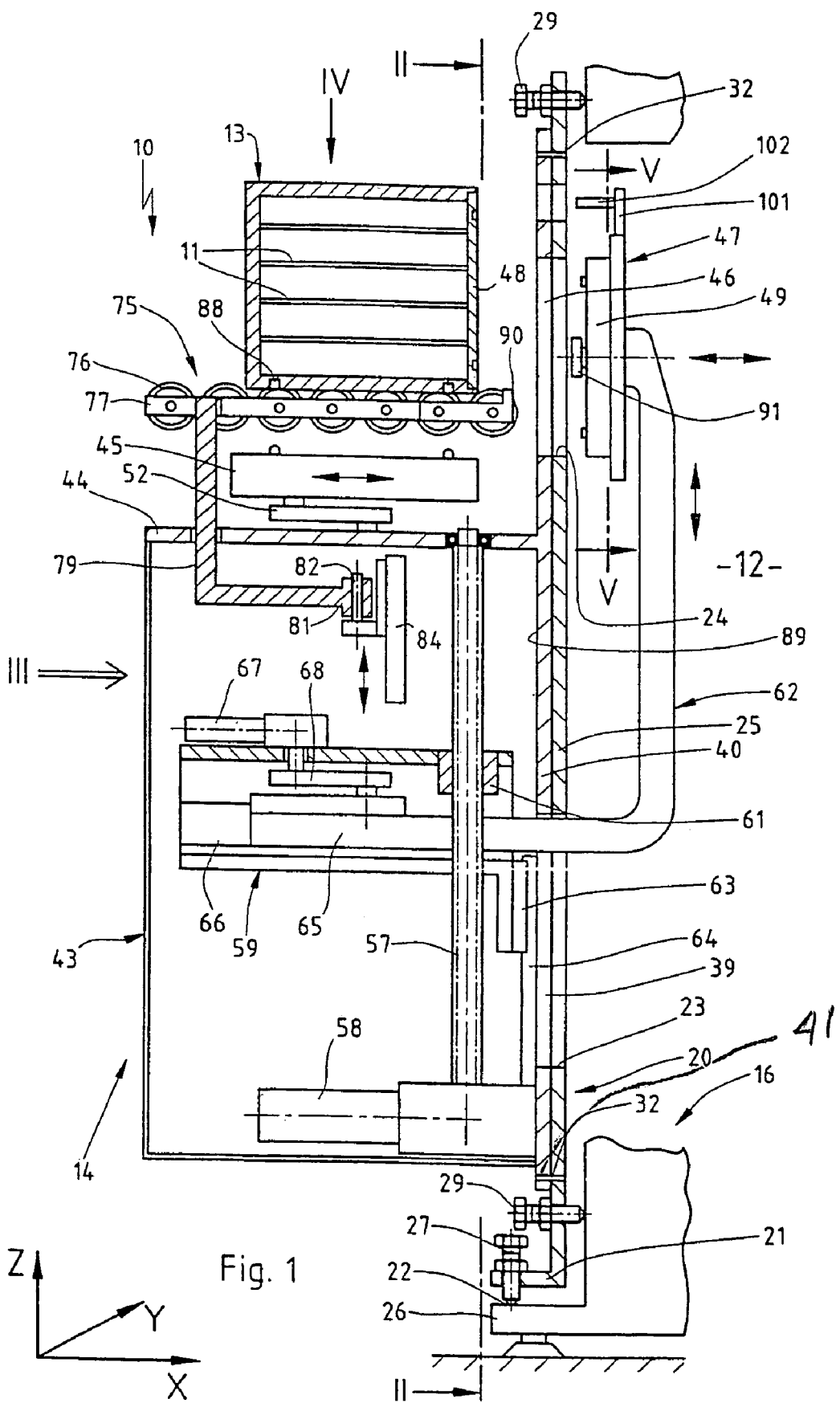
FIG. 1, is a lateral view in partial section of a device for loading and unloading substrates into or from a clean room in accordance with a preferred exemplary embodiment of the present invention.
Figure 2:
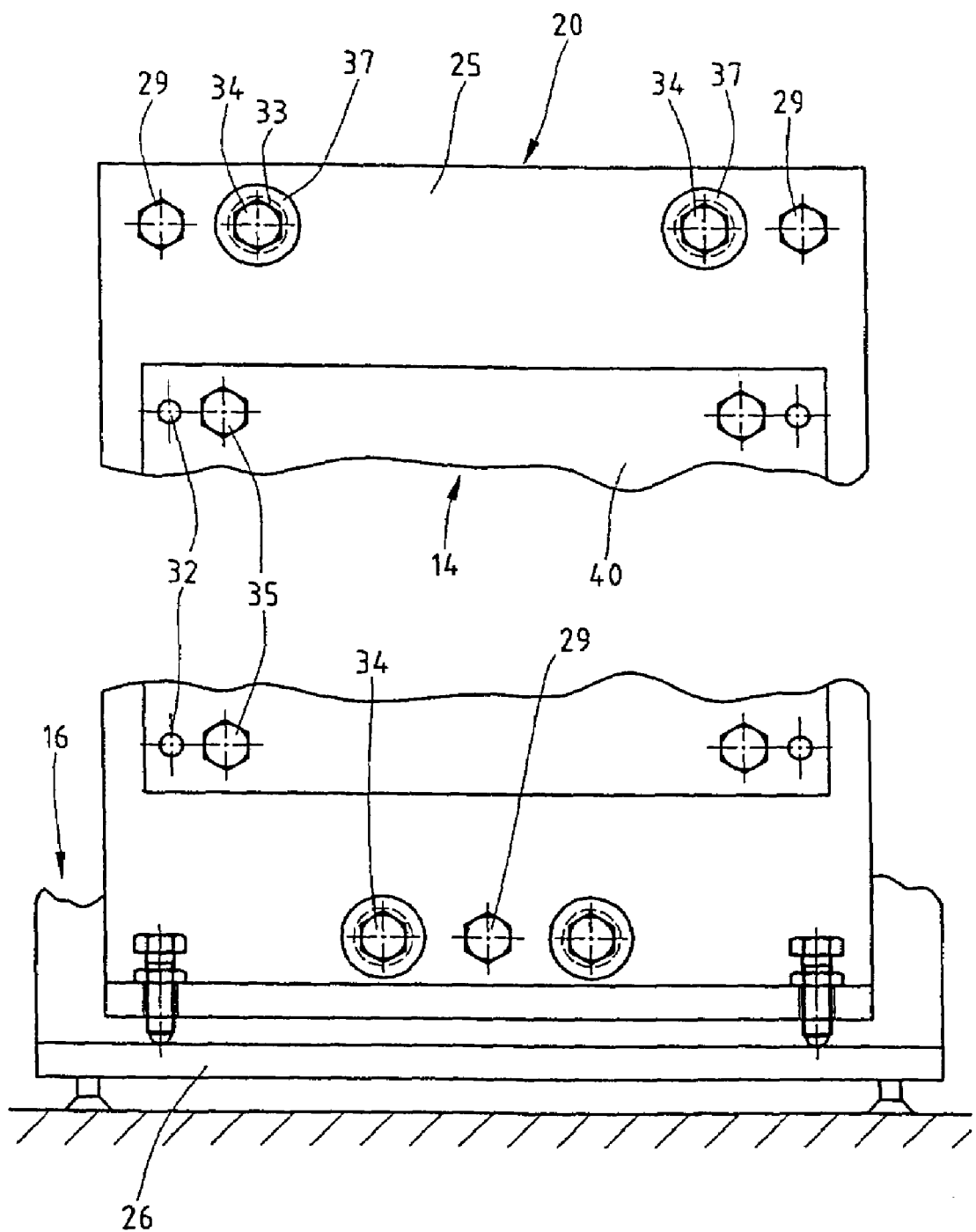
FIG. 2, is a plan view along the line II—II in FIG. 1 in a partial broken representation.

In accordance with FIGS. 1 and 2, the device 10 for loading and unloading substrates 11 into or from a clean room 12 has a lock device 14, which holds or receives a transport box 13 with the substrates 11, for transferring or receiving the substrates 11 to or from a processing installation 16, which forms the clean room 12 and has, in a manner not represented, a manipulating device for receiving or transferring the substrates 11 from or to the transport box 13.

The device 10 has an adapter device 20, which is arranged between the lock device 14 and the processing installation 16, for the vertical and horizontal adjustment of the lock device 14 with respect to the processing installation 16, independently of their possibly not exactly vertically and/or horizontally aligned positions. The adapter device 20 has a base plate 25, which is provided with an upper opening 24 and a lower opening 23. The base plate 25 rests adjustably on a strip 26, which is fixed in place and here is a part of the processing installation 16, and on which two vertical forcing screws 27, which are provided with spherical rollers 22, are supported and are held at a distance from an angle element 21 of the base plate, and can be vertically screwed in or out. The base plate 25 can be displaced on the strip 26 in the horizontal X-direction, as well as in the Y-direction, which extends transversely with respect to it. By means of the displaceability of each one of the forcing screws 27, the base plate 25 can also be moved in the vertical Z-direction and can be inclined with respect to it. In an upper and a lower area 22 and 23, the base plate 25 is provided with forcing screws 29, which are arranged at a distance and can be screwed in or out and in the mounted state are supported on a surface of the processing installation 16. An alignment of the base plate 25 with respect to the processing installation 16 can take place by adjusting each one of the forcing screws 29, wherein a pivot movement of the base plate 25 with respect to the X- and/or the Y-axes is possible.

Figure 4:
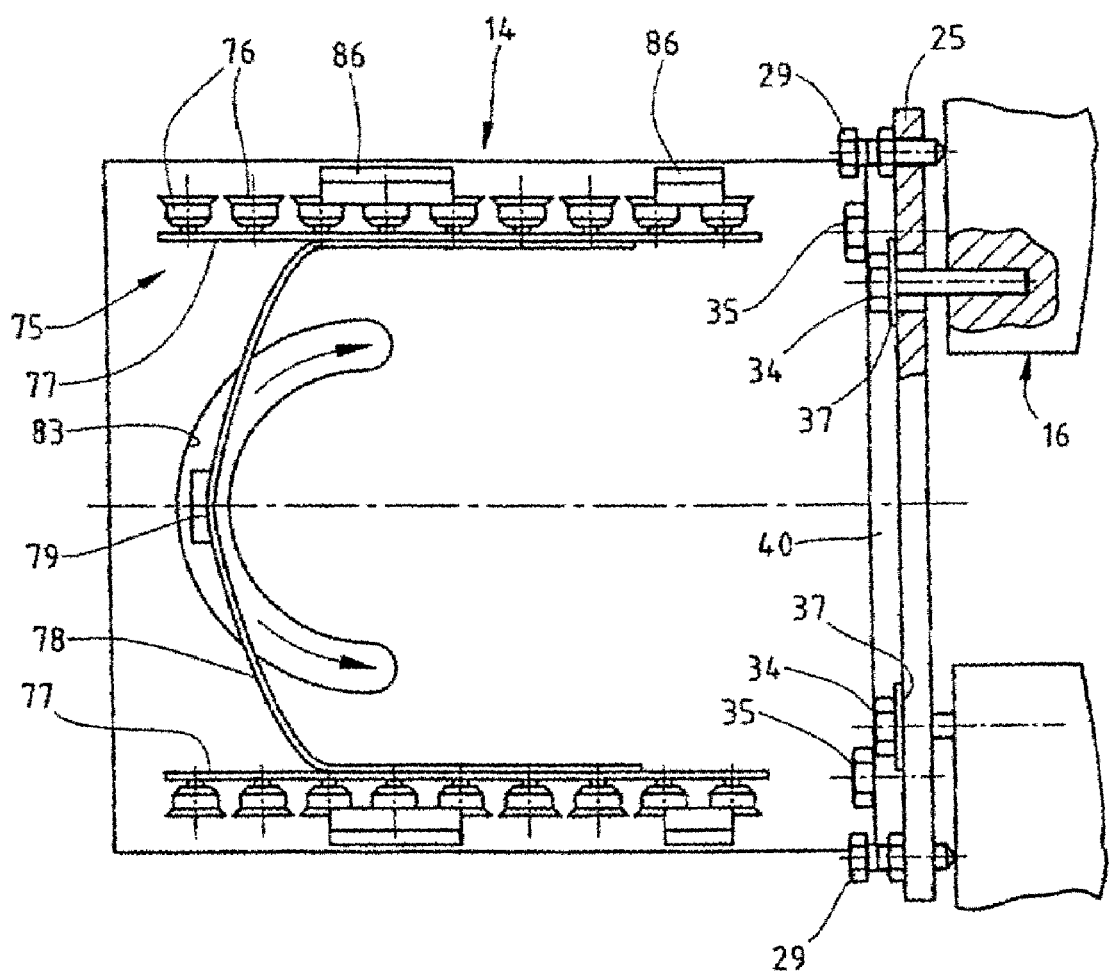

The base plate 25 has bores 33 of large diameter near the forcing screws 29, through which fastening screws 34 of smaller diameter pass, which can be screwed into threaded bores 36 of an adjoining part of the processing installation 16, and whose head is supported on a washer 37 (FIG. 4). Because of this, an adjustment, for example in the mm range, is possible, and the position of the adapter device 20, which is adjusted in respect to the processing installation 16, can be fixed in place.

Here, the base plate 25 of the adapter device 20 is equipped with indexing pins 32 and threaded bores 42, for example four. A vertical base plate 40 of the lock device 14 has bores 41 in a corresponding bore pattern for the essentially play-free receipt of the indexing pins 32 and screws 35 for screwing into the threaded bore 42.

Because of the adjustment of the adapter device 20 with respect to the processing installation 16, and the releasably pluggable connection with the lock device 14, it is possible without any further adjustment measures to replace the lock device 14 with another lock device, which is provided with the same bore pattern on its base plate 40. Here, the base plate 40 and the base plate 25 lie flat against each other.

In accordance with FIG. 1, the lock device 14 has a housing 43, whose front is closed off by the base plate 40, which extends past the top of the housing 43. The upper cover of the housing 43 is formed by a support plate 44, above which a receiving table 45 for the transport box 13 is held. In a manner still to be described, the receiving table 45 can be moved back and forth with respect to the vertical base plate 40 and can be docked against the latter with the transport box 13.

The base plate 40 has a lock window 46, which is aligned with the coaxial opening 24 of the base plate 25, both of which can be closed by means of a lock door 47. The transport box 13 has an opening 48 coaxially with the lock window 46, which can be hermetically sealed by means of a cover 49. The transport box 13 is displaced toward the base plate 40 for receiving or transferring the substrates 11 from or to the transport box 13. In a manner yet to be described, the cover 49 is unlocked from the transport box 13 with the aid of the lock door 47, is removed and connected with the lock door 47. Once the lock door 47 with the cover 49 is moved out of the area of the lock window 46, the substrates 11 can be removed from the transport box 13 with the aid of the manipulation device, not represented, and brought to the processing installation 16 (into the clean room 12), or vice versa. It is understood that, following the loading of the transport box 13, the cover 49 is connected with the transport box 13 in a correspondingly reverse manner for the hermetic sealing of the opening 48 of the latter, and is unlocked from the lock door 47 and removed.

All drive and transfer elements necessary for the movement of the receiving table 45 and the lock door 47 are arranged inside the housing 43 of the lock device 14. A gear motor, not represented, is flanged to the underside or inside of the support plate 44 and is connected via a crank gear 52 with the receiving table 45 for moving the latter horizontally back and forth. For this purpose the crank gear 52 has a crank roller, which engages a lower circular groove of the receiving table 45, so that the receiving table 45 can be moved along rails.

A threaded spindle 57 is seated in the support plate 44, which extends vertically downward and can be driven at its bottom by a gear motor 58. A carriage housing 59 can be moved up and down along the threaded spindle 57 via a nut 61. The carriage housing 59, open toward the base plate 40, receives the horizontal portion of an L-shaped arm 62, on whose vertical arm end the lock door is fastened. Facing away from the nut 61, the carriage housing 59 has a carriage 63, which is guided, vertically displaceable, along a vertical guide 64, which is held on the base plate 40. The end of the horizontal portion of the L-shaped are 62, which passes through the opening 23 of the base plate 25 and an opening 39 of the base plate 40, is embodied as a carriage 65, which is guided, horizontally displaceable back and forth, on a horizontal guide 66 of the carriage housing 59. The horizontal displacement of the L-shaped arm 62 takes place by means of a gear motor 67 flanged to the carriage housing 59, which drives a crank gear 68, whose crank roller loosely engages a circular groove of the carriage portion 65 of the L-shaped arm 62. In this way the lock door 47 is horizontally moved toward and away from the lock window 46 or the opening 24 with the aid of the gear motor 67, while the L-shaped arm 62, and therefore the lock door 47, can be moved with the aid of the gear motor 58 in the vertical direction out of or into the area of the lock window 46.

Figure 3:
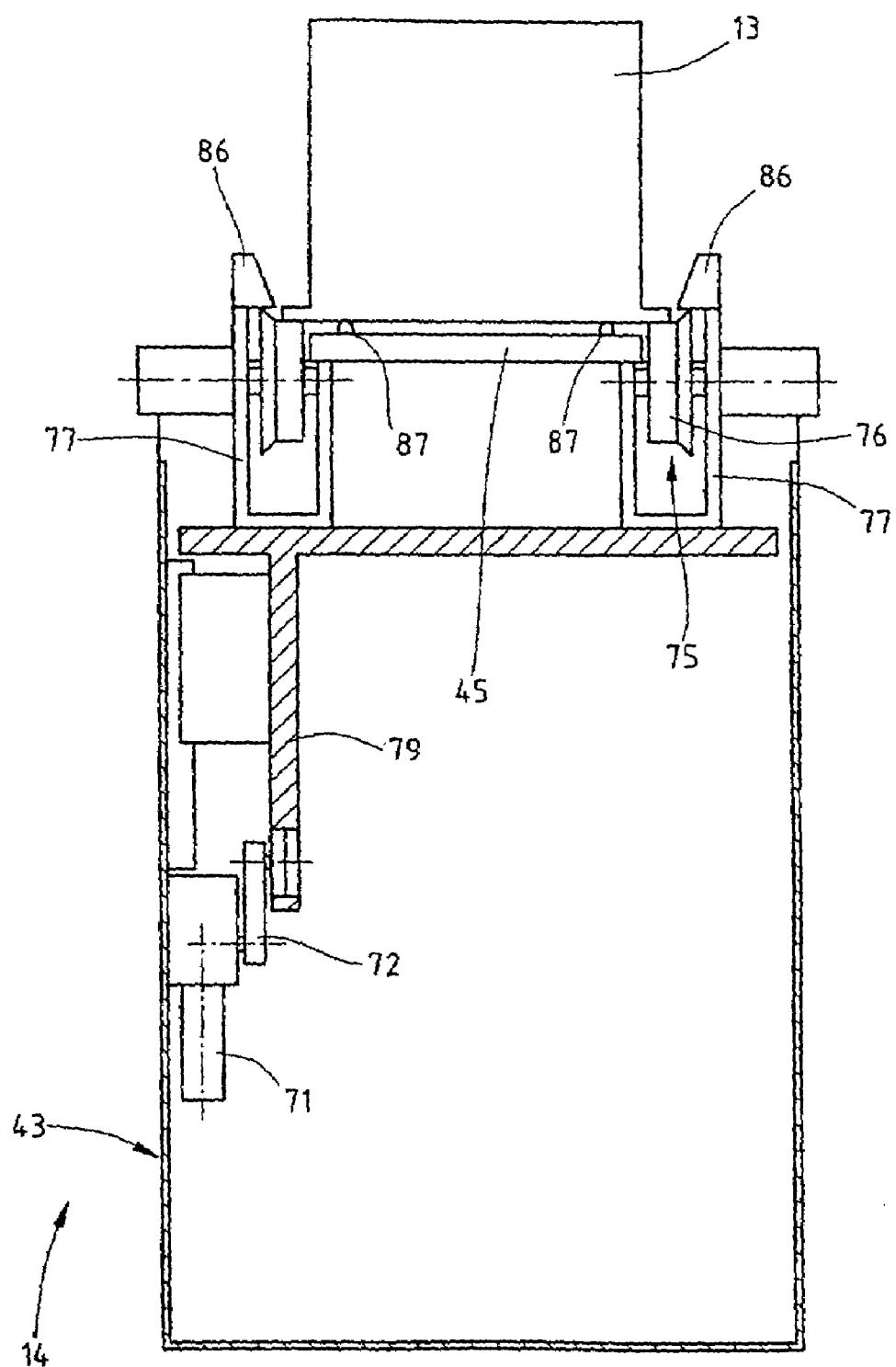
FIG. 3, is a plan view in partial section in accordance with the arrow III in FIG. 1, FIG. 4, is a view from above in accordance with the arrow IV in FIG. 1, but without the transport box.

In accordance with FIGS. 1, 3 and 4, the lock device 14 has a roller track 75 in the area of the receiving table 45, which has parallel roller strips 77 equipped with rollers 76 on both longitudinal sides of the receiving table 45. The two roller strips 77 are rigidly connected with each other by means of an arched U-shaped rail 78. In a center area between the two roller strips 77, the U-shaped rail 78 is fixedly connected with the upper end of an angular lever 79, whose vertical portion is conducted through the support plate 44, and whose lower horizontal return portion supports a bearing bushing 81 on its free end, through which a vertical shaft 82 is passed. The support plate 44 is provided with a semicircular recess 83, which the lever 79 penetrates and whose radius corresponds to the pivot radius of the lever 79 around the shaft 82. The shaft 82 receiving the bearing bushing 81 is guided up and down in the vertical direction on a stationary guide 84. The pivot movement and the vertical up and down movement of the lever 79 are performed, partially not represented, by means of a motor. The lifting motion of the roller track 75 is for example provided by the already mentioned arrangement of the gear motor 71 and the crank gear 72. By means of the pivot movement of the lever 79 around the shaft 82, the roller track 75 can be brought out of a position oriented toward the base plate 40 or the lock window 46 into a position moved in one or the other pivot direction by 90°. In this way a transport box 13 can be brought horizontally on the roller track 75 from three directions, which are located vertically in respect to each other, or any arbitrary positions between these. The roller strips 77 of the roller track 75 have vertically upward extending insertion slopes 86, for example in each of two distanced areas, which make the placement of a transport box 13 on the roller track 75 from above possible. By depositing or rolling a transport box up on the roller track 75, pre-positioning of the transport box in respect to the receiving table 45 has been achieved.

Because of the guide 84 for the shaft 82, the roller track 75 can be raised or lowered with respect to the receiving table 45. In the raised position (FIG. 1), a transport box 13 is placed on the roller track 75 or moved away from it or lifted off. In the lowered position (FIG. 3), Fixation pins 87 provided on the receiving table 45 and arranged at a distance from each other engage corresponding blind receiver bores 88 on the underside of the transport box 13, so that the exact positioning of the transport box 13 on the receiving table 45 is achieved. In the exemplary embodiment represented, there are three fixation pins 87 arranged in a triangle, for example.

The two roller strips 77 of the roller track 75 are provided with a slight descending slope in such a way that an inclination in respect to the docking or loading level 89 is achieved, wherein one or both roller strips 77 are provided with a stop 90 on this end.

Figure 5:
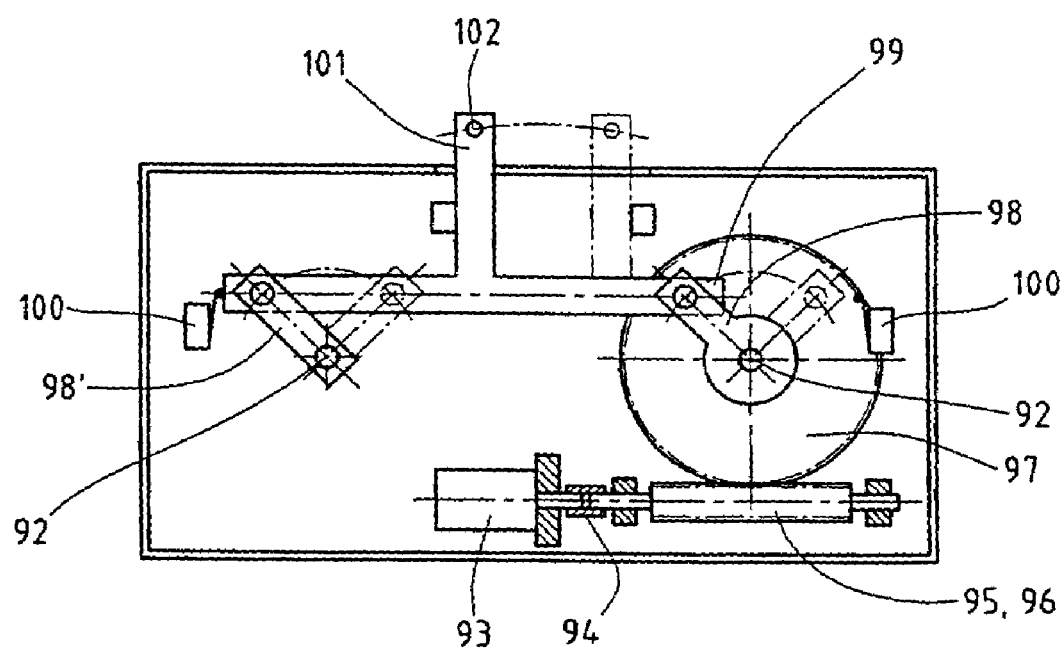
FIG. 5, is a section along the line V—V in FIG. 1.

FIG. 5 shows the locking mechanism for or of the cover 49 with the transport box 13. Two spaced apart T-shaped keys 91 are pivotably maintained on respective stationary shafts 92. They are driven by a gear motor 93, which is connected with a worm wheel 96 via a coupling 94 and a worm shaft 95. A clutch disk 97 is frictionally connected with the worm wheel 96 and is connected, fixed against relative rotation, with a first crank lever 98, which is connected via a hinged rod 99 with a second crank lever 98'. A parallelogram gear is achieved in this way. The movement of the hinged rod 99 is limited by stops 100 and 100', which are equipped with limit switches. The hinged rod 99 has a lever shoulder 101 approximately at the center, which is laterally conducted toward the outside of the cover 49 and which, in case of the loss of the motor drive, makes it possible to perform or finish the opening or closing process manually against the frictional resistance of the blocked gear and the natural opening or closing force. The shoulder 101 is conducted through a lateral opening of the lock door 47, and it can be actuated via a bolt 102 connected with it. It can be seen that this locking mechanism is arranged inside the lock door 47, so that it is axially connected with or released from the keys 91 when the cover 49 is set down or lifted.

The invention claimed is:

1. A device for loading or unloading substrates into or out of a clean room, comprising:
    a lock device provided with a hermetically sealable lock opening which provides access to the clean room;
    a transport box having substrates situated therein, said transport box being received on said lock device for movement through said hermetically sealable lock opening into or out of the clean room;
    a processing installation adjoining said hermetically sealable lock opening; and
    an adapter device arranged between said processing installation and said lock device, and being held on said processing installation and adjustably oriented relative thereto, said lock device being releasably fastened on said adapter device.

2. The device as defined in claim 1, wherein said adapter device includes means for adjusting said adapter device according to one of: height with respect to said processing installation, inclination with respect to a vertical axis defined by the device for loading or unloading substrates, inclination with respect to a horizontal axis defined by the device for loading or unloading substrates, and displacement relative to at least one of said vertical axis and said horizontal axis.

3. The device as defined in claim 1, wherein said processing installation includes a stationary element, and wherein said adapter device has an underside with two spaced apart, height-adjustable forcing screws which are held on said stationary element.

4. The device as defined in claim 3, wherein said adapter device is seated and displaceable on said stationary element according to at least one of: longitudinally and transversely.

5. The device as defined as in claim 1, wherein said adapter device is provided with a plurality of adjustable forcing screws which engage said processing installation.

6. The device as defined in claim 1, further comprising:
    fastening screws for fixing in place said adapter device relative to said processing device, and wherein said adapter device includes bores through which a respective one of said fastening screws passes, said bores having a diameter which is larger than that of said fastening screws.

7. The device as defined in claim 1, wherein said lock device has a plurality of receiving bores, and wherein said adapter device includes spaced apart indexing pins plugged into a respective one of said receiving bores, said indexing pin being fittingly and essentially free of play when plugged into a respective one of said receiving bores.

8. The device as defined in claim 7, wherein said lock device includes a base plate which has a bore pattern corresponding to the arrangement of said indexing pins.

9. The device as defined in claim 1, wherein said lock device has a displaceable receiving table for said transport box, and a roller track in the area of said receiving table.

10. The device as defined in claim 9, wherein said roller track is pivotable through an angle of about 180° around a vertical axis defined by the device for loading or unloading substrates.

11. The device as defined in claim 9, wherein said roller track is provided with vertically upwardly extending lateral insertion slopes.

12. The device as defined in claim 9, wherein said roller track has a stop, and is slightly inclined in the direction toward one of: said processing installation and a loading and unloading level.

13. The device as defined in claim 9, wherein said roller track includes two parallel track elements which extend on both sides of said receiving table, and a connecting hoop which connects said track elements.

14. The device as defined in claim 9, wherein said roller track can be raised and lowered with respect to said receiving table.

15. The device as defined in claim 1, further comprising:
   at least one crank drive; and
   a lock door, wherein said lock device includes a roller track and a receiving table, and wherein closing movement of said lock door, displacement movement of said receiving table, and lowering movement of said roller track are derived from said at least one crank drive.

16. A device for loading or unloading substrates into or out of a clean room, comprising:
   a lock device provided with a hermetically sealable lock opening which provides access to the clean room;
   a transport box having substrates situated therein, said transport box being received on said lock device for movement through said hermetically sealable lock opening into or out of the clean room;
   a processing installation adjoining said hermetically sealable lock opening; and
   an adapter device arranged between said processing installation and said lock device, and being held on said processing installation and adjustably oriented relative thereto, said lock device being releasably fastened on said adapter device, wherein said lock device has a displaceable receiving table for said transport box, and a roller track in the area of said receiving table, wherein said roller track includes two parallel track elements which extend on both sides of said receiving table, and a connecting hoop which connects said track elements, and
   wherein said roller track further includes a lever and a vertical shaft, and wherein said connecting hoop is connected with said lever, whose other end is pivotably maintained on said vertical shaft.

17. The device as defined in claim 16, wherein one of: said lever and said pivot shaft, are displaceable in height.

18. A device for loading or unloading substrates into or out of a clean room comprising:
   a lock device provided with a hermetically sealable lock opening which provides access to the clean room;
   a transport box having substrates situated therein, said transport box being received on said lock device for movement through said hermetically sealable lock opening into or out of the clean room;
   a processing installation adjoining said hermetically sealable lock opening; and
   an adapter device arranged between said processing installation and said lock device, and being held on said processing installation and adjustably oriented relative thereto, said lock device being releasably fastened on said adapter device, and
   a lock door including a cover for said transport box, wherein said cover is provided with two T-shaped keys, which can be rotated by means of a parallelogram drive maintained in said lock door, and wherein said lock opening is hermetically sealed by means of said lock door, said lock door being connected to said cover.

19. The device as defined in claim 18, further comprising:
   a clutch disk; and
   a motor-driven worm gear, wherein said clutch disk is connected with said parallelogram drive, and wherein said parallelogram drive is moved by said motor-driven worm gear.

20. The device as defined in claim 18, wherein said parallelogram drive has a hinged connecting rod from which a manual lever projects, said manual lever being accessible from the outside of the device for loading or unloading substrates.

* * * * *